United States Patent
Itaya

(10) Patent No.: US 10,250,038 B2
(45) Date of Patent: Apr. 2, 2019

(54) CENTRAL VOLTAGE CONTROL DEVICE AND MEASURING DEVICE

(71) Applicant: MITSUBISHI ELECTRIC CORPORATION, Chiyoda-ku, Tokyo (JP)

(72) Inventor: Nobuhiko Itaya, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 147 days.

(21) Appl. No.: 15/521,650

(22) PCT Filed: Dec. 19, 2014

(86) PCT No.: PCT/JP2014/083753
§ 371 (c)(1),
(2) Date: Apr. 25, 2017

(87) PCT Pub. No.: WO2016/098256
PCT Pub. Date: Jun. 23, 2016

(65) Prior Publication Data
US 2017/0244279 A1 Aug. 24, 2017

(51) Int. Cl.
*H02J 3/12* (2006.01)
*H02J 13/00* (2006.01)
(Continued)

(52) U.S. Cl.
CPC ............ *H02J 3/12* (2013.01); *G01R 19/1659* (2013.01); *G05B 15/02* (2013.01); *H02J 13/00* (2013.01); *H02J 13/0006* (2013.01)

(58) Field of Classification Search
CPC .......... H02J 13/00; H02J 3/12; H02J 13/0006; G01R 19/1659; G05B 15/02
See application file for complete search history.

(56) References Cited

U.S. PATENT DOCUMENTS

2010/0318238 A1* 12/2010 Bryson ................. G06F 1/26
                                                   700/298
2013/0134779 A1    5/2013 Watanabe et al.
(Continued)

FOREIGN PATENT DOCUMENTS

JP    2010-183701 A    8/2010
JP    2013-118804 A    6/2013
(Continued)

OTHER PUBLICATIONS

International Search Report (PCT/ISA/210) dated Feb. 10, 2015, by the Japanese Patent Office as the International Searching Authority for International Application No. PCT/JP2014/083753.
(Continued)

*Primary Examiner* — Daniel Cavallari-See
(74) *Attorney, Agent, or Firm* — Buchanan Ingersoll & Rooney PC

(57) ABSTRACT

The central voltage control device includes a power-distribution estimating unit to estimate a power distribution in the power distribution line on the basis of first received measurement information, a voltage-distribution estimating unit to estimate a voltage distribution of the power distribution line on the basis of the power distribution, a tap-position determining unit to determine a tap position of the voltage controller when a voltage deviates from the proper voltage range in the voltage distribution, and a correcting unit to correct the power distribution in the power distribution line on the basis of the received deviation information. When the power distribution is corrected, the voltage-distribution estimating unit estimates the voltage distribution using the corrected power distribution.

12 Claims, 5 Drawing Sheets

(51) Int. Cl.
  *G01R 19/165* (2006.01)
  *G05B 15/02* (2006.01)

(56) References Cited

U.S. PATENT DOCUMENTS

2014/0288725 A1   9/2014   Itaya
2015/0005979 A1   1/2015   Itaya

FOREIGN PATENT DOCUMENTS

WO   WO 2013/065114 A1   5/2013
WO   WO 2013/140555 A1   9/2013

OTHER PUBLICATIONS

Written Opinion (PCT/ISA/237) dated Feb. 10, 2015, by the Japanese Patent Office as the International Searching Authority for International Application No. PCT/JP2014/083753.

* cited by examiner

CENTRAL VOLTAGE CONTROL DEVICE AND MEASURING DEVICE

FIELD

The present invention relates to a central voltage control device and a measuring device in a voltage control system that controls the voltage of a power distribution system.

BACKGROUND

In general, a power distribution system is configured from a high-voltage system and a low-voltage system. A power receiving end of a general consumer is connected to the low-voltage system. A power company is obliged to maintain the voltage at the power receiving end of the general consumer in a proper voltage range. As an example, in the case of power reception of 100 volts, the power company is obliged to maintain the voltage at 95 volts to 107 volts. Therefore, the power company achieves the voltage maintenance at the power receiving end of the general consumer by adjusting a control amount of a voltage controller connected to the high-voltage system. Note that, in the following explanation, the power distribution system indicates the high-voltage system unless particularly noted otherwise.

A voltage controller of a transformer type such as an LRT (Load Ratio Transformer) or an SVR (Step Voltage Regulator) has an object of keeping the voltages at all points on a load side within a proper voltage range by changing the voltage on the load side according to tap operation based on LDC (Line Drop Compensator) control. In the LDC control, on the basis of an assumption that the voltage at a power distribution line end is lower as an electric current is larger, an appropriate load side voltage for keeping the voltages at all the points on the load side within the proper voltage range is calculated on the basis of voltage and current information measured by the voltage controller. The LDC control is based on the premise that a load distribution of a power distribution system is uniform, that is, the voltages at points in the power distribution system change in the same direction according to the elapse of time.

However, in recent years, because of the diversification of a way of using electricity and the spread of a distributed power supply, the load distribution of the power distribution system greatly changes according to the elapse of time. Therefore, a voltage situation of the entire power distribution system cannot be estimated only using the voltage and current information measured by the voltage controller. It is difficult to maintain the proper voltage. Therefore, for example, Patent Literature 1 described below discloses a system that a central voltage control device, which is a central device, collectively grasps measurement information of voltages and electric currents at points in the power distribution system via a communication network and commands a target voltage from the central voltage control device to the voltage controller.

CITATION LIST

Patent Literature

Patent Literature 1: WO 2013/065114

SUMMARY

Technical Problem

However, the conventional central voltage control device needs to periodically collect the voltage and current information at the points of the power distribution system. Because the number of these kinds of information is enormous, a high-speed communication network such as an optical network is necessary. There is a problem in that, even if the high-speed communication network such as the optical network can be maintained to a substation for power distribution or the vicinity of the substation for power distribution, cost is further required to construct the high-speed communication network over an entire power distribution line including a power distribution line end.

It is also conceivable to adopt a method of estimating a voltage of the entire power distribution line including the power distribution line ends on the basis of voltage and current information of the substations for power distribution or the vicinity of the substations for power distribution and controlling the power control device on the basis of the voltage of the entire power distribution line. However, this method uses only a small number of measurement points, voltage estimation accuracy in the power distribution line is not high. Therefore, power control is performed on the basis of an estimated value that is not highly accurate. It is likely that deviation from the proper voltage range occurs.

The present invention has been devised in view of the above and an object of the present invention is to obtain a central voltage control device that can reduce the cost and suppress the deviation from the proper voltage range in the power distribution line.

Solution to Problem

There is provided a central voltage control device according to an aspect of the present invention in a voltage control system including a first measuring device configured to measure a voltage and electric power of a power distribution line of a high-voltage system and transmit the measured voltage and the measured electric power as measurement information, a second measuring device configured to measure the voltage of the power distribution line and transmit deviation information, which is information indicating whether the measured voltage deviates from a proper voltage range, an information amount of the deviation information being smaller than an information amount of the measurement information, and a voltage controller configured to control the voltage of the power distribution line. The central voltage control device includes: a power-distribution estimating unit to estimate a power distribution in the power distribution line on the basis of the measurement information received from the first measuring device; a voltage-distribution estimating unit to estimate a voltage distribution in the power distribution line on the basis of the power distribution; a control-amount determining unit to determine a control amount of the voltage controller when there is a part where a voltage deviates from the proper voltage range in the voltage distribution; and a correcting unit to correct the power distribution in the power distribution line on the basis of the deviation information received from the second measuring device, wherein when the power distribution in the power distribution line is corrected by the correcting unit, the voltage-distribution estimating unit estimates the voltage distribution of the power distribution line using the corrected power distribution.

Advantageous Effects of Invention

The central voltage control device and the measuring device according to the present invention achieve an effect that it is possible to reduce the cost and suppress the deviation from the proper voltage range in the power supply line.

DESCRIPTION OF EMBODIMENTS

A central voltage control device and a measuring device according to an embodiment of the present invention are explained in detail below with reference to the drawings. Note that the present invention is not limited by the embodiment.

Embodiment

Figure 1:
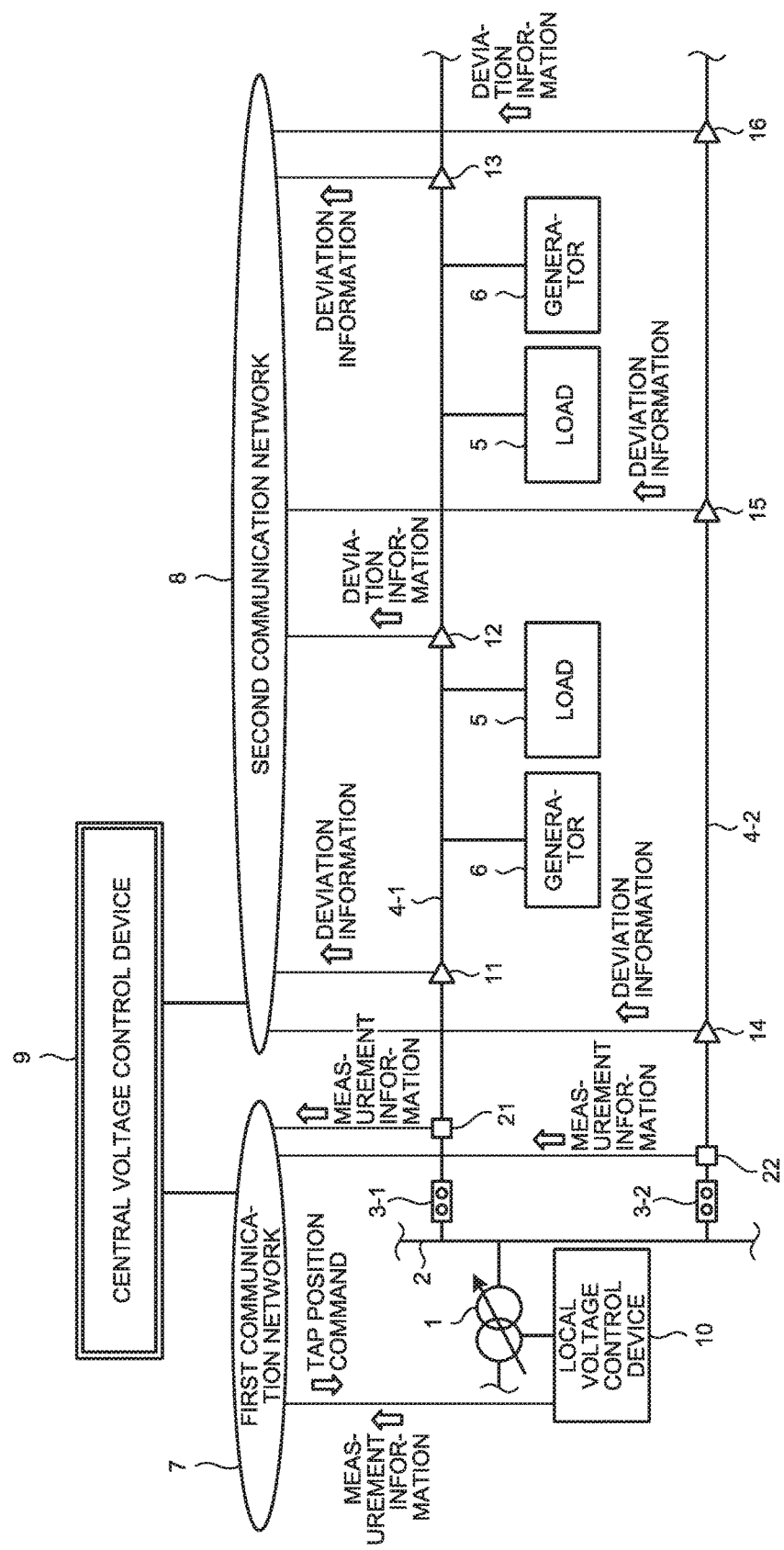
FIG. 1 is a diagram showing a configuration example of a voltage control system including a central voltage control device according to an embodiment of the present invention.

FIG. 1 is a diagram showing a configuration example of a power control system including a central voltage control device according to an embodiment of the present invention. In FIG. 1, a voltage controller 1 is an LRT (Load Ratio Control Transformer) functioning as a transformer for power distribution set in, for example, a substation. A local voltage control device 10 is connected to the voltage controller 1. The local voltage control device 10 controls the voltage controller 1. The local voltage control device 10 can be set integrally with or annexed to the voltage controller 1. The local voltage control device 10 controls the voltage controller 1 by adjusting a control amount of the voltage controller 1, specifically, by adjusting a tap position. The local voltage control device 10 has a communication function and is connected to a first communication network 7, which is a high-speed communication network such as an optical network.

A bus 2 is connected to a secondary side of the voltage controller 1. Two power distribution lines 4-1 and 4-2 are connected to the bus 2 in parallel. The power distribution lines 4-1 and 4-2 are power distribution lines of a high-voltage system. A voltage level of the high-voltage system is, for example, 6600 volts. Measuring devices 21 and 22 are respectively connected to end portions, that is, delivery points upstream in the power distribution lines 4-1 and 4-2. The measuring devices 21 and 22, which are first measuring devices, respectively measure voltages and power flows of the power distribution lines 4-1 and 4-2 and transmit the measured voltages and power flows to a central voltage control device 9 through the first communication network 7 as measurement information. A cycle of the transmission of the measurement information by the measuring devices 21 and 22 are not limited. As an example, the cycle can be set to a cycle of several ten seconds to several minutes.

One end of the power distribution line 4-1 is connected to the bus 2 via a breaker 3-1. On the power distribution line 4-1, measuring devices 11 to 13, which are second measuring devices that measure the voltage of the power distribution line 4-1, are set. The measuring devices 11 to 13 are connected to a second communication network 8, which is a communication network having transmission speed lower than the transmission speed of the first communication network 7. The measuring devices 11 to 13 respectively measure the voltages of the power distribution line 4-1 in connecting parts and, when the measured voltages deviate from a proper voltage range, transmit deviation notifications, in which deviation information explained later is stored, to the central voltage control device 9. Note that the measuring devices 11 to 13 can measure power flows and the like other than the voltages.

On the power distribution line 4-1, a low-voltage power distribution line configuring a low-voltage system is connected via a not-shown transformer. Loads 5 or generators 6 such as solar power generation devices are connected to the low-voltage power distribution line. Note that rechargeable batteries or the like can be connected other than the generators 6. The low-voltage system has a voltage level of, for example, 100 volts to 200 volts. Note that, on the power distribution line 4-1, a voltage controller such as a static var compensator (SVC) that autonomously performs control without receiving a control command from the central voltage control device 9 can be connected.

One end of the power distribution line 4-2 is connected to the bus 2 via a breaker 3-2. On the power distribution line 4-2, measuring devices 14 to 16, which are second measuring devices that measure the voltage of the power distribution line 4-2, are set. The measuring devices 14 to 16 are connected to the second communication network 8. The measuring devices 14 to 16 measure the voltages of the power distribution line 4-2 in connecting parts and, when the measured voltages deviate from a proper voltage range, transmit deviation notifications, in which deviation information explained later is stored, to the central voltage control device 9. Note that the measuring devices 14 to 16 can measure power flows and the like other than the voltages.

On the power distribution line 4-2, a low-voltage power distribution line configuring a low-voltage system is connected via a not-shown transformer. A load and a generator not shown in the figure are connected to the low-voltage power distribution line. Note that, on the power distribution line 4-2, a voltage controller that autonomously performs control without receiving a control command from the central voltage control device 9 can be connected.

In this embodiment, voltage control of a power distribution system means voltage control of a high-voltage system. Note that, in an illustrated example, the number of power distribution lines connected to the bus 2 is set to, for example, two. However, the number of power distribution lines is not limited to this example and can be three or more. The numbers of the set loads 5, generators 6, and measuring devices 11 to 16 are not limited to the illustrated example.

The central voltage control device 9 estimates a voltage distribution for each of the power distribution lines on the basis of the measurement information received from the measuring devices 21 and 22 through the first communication network 7 and the deviation notifications received from the measuring devices 11 to 16 through the second communication network 8, and performs optimum calculation on the basis of the estimated distribution to determine a control amount of the voltage controller 1, that is, a tap position. The central voltage control device 9 transmits a tap position command to the local voltage control device 10, which controls the voltage controller 1, through the first communication network 7. The local voltage control device 10 controls the voltage controller 1 on the basis of the received tap position command.

On the other hand, when measurement information of the power distribution lines is used for the voltage control of the power distribution system, because both of an information amount and a transmission frequency of the measurement information are high, it is desirable to use a high-speed communication network. A range is limited in the vicinity of the substation even if the high-seed first communication network 7 is constructed. Accordingly, cost is not so high. Therefore, the central voltage control device 9 can acquire the voltages at delivery points of the power distribution lines in the vicinity of the substation and measurement values of power flows, that is, the measurement information from the measuring devices 21 and 22 through the high-speed communication network.

On the other hand, when measurement of a voltage and the like is performed using the measuring devices to the ends of the power distribution lines 4-1 and 4-2, a geographical range is a wide range. Cost increases when the high-speed communication network is constructed. Therefore, in this embodiment, the measuring devices 11 to 16 that measure voltages at points other than the delivery points of the power distribution lines 4-1 and 4-2 are connected to the second communication network 8, which is a low-speed communication network that can be inexpensively constructed. When the measured voltages deviate from the proper voltage range, the measuring devices 11 to 16 transmit deviation notifications, in which deviation information is stored, to the central voltage control device 9 through the second communication network 8. In this embodiment, the measuring devices 11 to 16 transmit the deviation information explained below rather than the measurement information itself to reduce an information amount to be transmitted and reduce a transmission frequency as well. Consequently, the measuring devices 11 to 16 can grasp situations in the power distribution lines 4-1 and 4-2 using the low-speed second communication network 8.

The power distribution lines 4-1 and 4-2 are divided into several sections and managed. The sections are divided by not-shown switches. In general, a communication network is constructed to change a system configuration by switching the switches through remote operation. For the communication network, because a range that should be covered is an extremely wide range, a low-cost low-speed communication network such as a power distribution carrier or a low-speed metal line is used. For the purpose of controlling ON/OFF of the switches, because an amount of control information is small, the low-cost low-speed communication network is sufficient. The network for the switch control is hereinafter referred to as switch network. The switch network can be used as the second communication network 8 shown in FIG. 1. Consequently, it is possible to perform the transmission of the deviation notifications from the measuring devices 11 to 16 to the central voltage control device 9 using a facility constructed as the switch network without preparing the second communication network 8 anew.

Further, as the switches, there are switches called sensor switches integrated with measuring devices. When measuring device portions of the sensor switches are the measuring devices 11 to 16 in this embodiment, it is possible to efficiently configure a voltage control system. A device that centrally controls the switches can be set separately from the central voltage control device 9 in this embodiment. The device that centrally controls the switches and the central voltage control device 9 in this embodiment can be integrated.

Note that the measuring devices 11 to 16 in this embodiment are not limited to the measuring devices mounted on the sensor switches and can be set independently from the switches. As the measuring devices 11 to 16, the measuring devices mounted as the sensor switches and the measuring devices set independently from the switches can be mixed.

Figure 2:
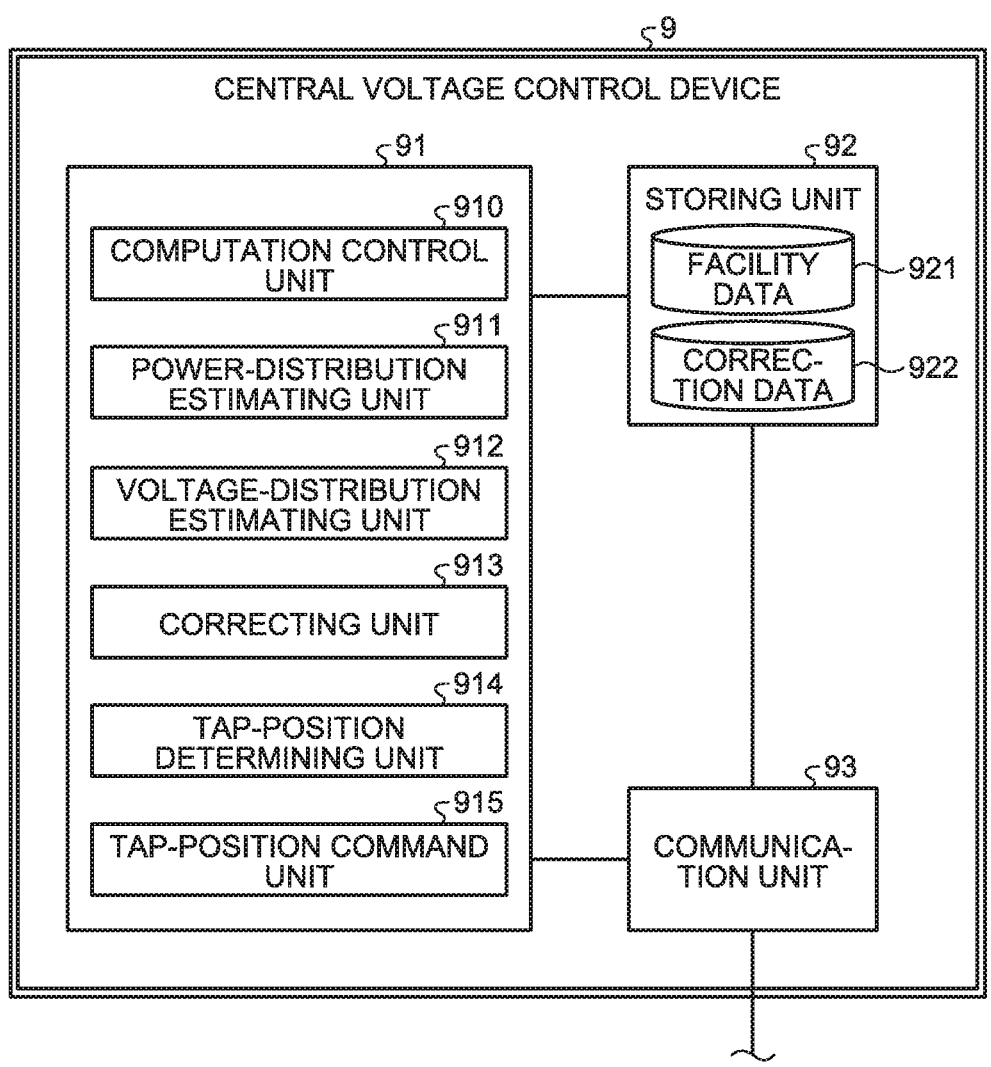
FIG. 2 is a diagram showing a configuration example of the central voltage control device.

FIG. 2 is a diagram showing a configuration example of the central voltage control device 9 in this embodiment. The central voltage control device 9 in this embodiment includes a computing unit 91, a storing unit 92 and a communication unit 93. The computing unit 91 estimates voltage distributions in the power distribution lines on the basis of the measurement information received from the measuring devices 21 and 22 and the deviation notifications received from the measuring devices 11 to 16, and determines a tap position of the voltage controller 1 on the basis of an estimation result. The storing unit 92 stores facility data 921, correction data 922, and the like. The communication unit 93 that performs communication processing of communication performed through the first communication network 7 and communication processing of communication performed through the second communication network 8. The facility data 921 includes pieces of information such as connecting positions, rated capacities, and operating ratios of loads, generators, capacitors, and the like connected to the power distribution lines 4-1 and 4-2, information indicating impedance per unit length of the power distribution lines, and the like. The correction data 922 is data of virtual loads and virtual generators used in performing correction on the basis of deviation notifications explained below.

The computing unit 91 includes a computation control unit 910 that controls computation; a power-distribution estimating unit 911 that estimates power distributions in the power distribution lines 4-1 and 4-2 on the basis of the measurement information received from the measuring devices 21 and 22 and the pieces of information such as the connecting positions, the rated capacities, and the operating ratios of the loads, the generators, the capacitors, and the like stored in the facility data 921, a voltage-distribution estimating unit 912 that estimates voltage distributions by means of power flow calculation on the basis of the power distributions estimated by the power-distribution estimating unit 911 and the impedance of the power distribution lines; a correcting unit 913 that corrects the power distributions when the deviation notifications are received from the measuring devices 11 to 16; a tap-position determining unit 914, which is a control-amount determining unit that performs optimum voltage distribution calculation and determines a control amount, that is, a tap position of the voltage controller 1; and a tap-position command unit 915, which is a control-amount command unit that outputs the determined tap position to the communication unit 93 as a tap position command.

The communication unit 93 transmits the tap position command, which is output from the tap-position command unit 915, to the local voltage control device 10. The communication unit 93 outputs the measurement information received via the first communication network 7 to the computing unit 91 and, when receiving the deviation notifications explained below from the measuring devices 11 to 16 via the second communication network 8, outputs the deviation notifications to the computing unit 91.

The computation control unit 910 instructs the power-distribution estimating unit 911 and the voltage-distribution estimating unit 912 to carry out processing at every central control cycle, which is a cycle for calculating a voltage command. As the central control cycle, any value can be set. As an example, the central control cycle can be set to five minutes. When receiving a deviation notification from a part that is estimated as having a voltage within the proper voltage range by the voltage-distribution estimating unit 912, the computation control unit 910 instructs the correcting unit 913 and the voltage-distribution estimating unit 912 to carry out processing. When the correction is performed by the correcting unit 913 or when the voltage estimated by the voltage-distribution estimating unit 912 is determined as deviating from the proper voltage range, the computation control unit 910 instructs the tap-position determining unit 914 and the tap-position command unit 915 to carry out processing.

The power-distribution estimating unit 911 calculates, for each of the power distribution lines 4-1 and 4-2, ratios of electric power of facilities such as loads and power generation facilities on the basis of the facility data 921. The power-distribution estimating unit 911 apportions, on the basis of the ratios of the electric power of the facilities, electric power indicated in the measurement information received from the measuring devices 21 and 22. Note that, concerning the loads, a profile of load power can be decided in advance for each of time periods of one day and stored as the facility data 921. The load power corresponding to each time period can be used. A load profile can be retained for each of days of the week, seasons, and the like. The load profile to be used can be selected according to a day of the week, a season, and the like. Concerning the power generation facility that performs solar power generation, a rated power generation capacity can be used or a profile for each of time periods can be retained. A profile can be retained for each combination of temperature and weather. The profile corresponding to a combination of temperature and weather can be selected. Prediction of loads and power generation amounts can be performed on the previous day on the basis of, for example, a day of week, weather, and prediction of temperature of the following day. Predicted values can be retained in the storing unit 92. The power-distribution estimating unit 911 can calculate ratios of electric power of the facilities on the basis of the predicted values.

The optimum voltage distribution calculation performed by the tap-position determining unit 914 is calculation for determining an optimum voltage distribution in a period of a central control cycle and an optimum control amount of the voltage controller 1. Note that the optimum voltage distribution is a voltage distribution for points of the system that satisfy limiting conditions and optimizes an evaluation function. The optimum control amount is a control amount commanded to the voltage controller 1 such that the optimum voltage distribution is realized. As the evaluation function, a violation amount, that is, a deviation amount from a proper voltage range of the voltages at each point of the power distribution system is used. The voltages at the points of power distribution system and the like can be further taken into account as the evaluation function.

Figure 3:
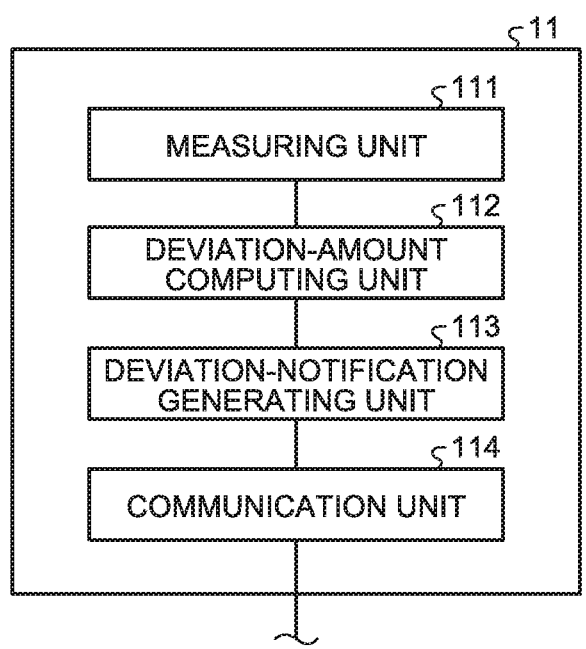
FIG. 3 is a diagram showing a configuration example of a measuring device.

FIG. 3 is a diagram showing a configuration example of the measuring device 11. The configurations of the measuring devices 12 to 16 are the same as the configuration of the measuring device 11. As shown in FIG. 3, the measuring device 11 includes a measuring unit 111, a deviation-amount computing unit 112, a deviation-notification generating unit 113, and a communication unit 114. The measuring unit 111 measures the voltage of a power distribution line to which the measuring device 11 is connected, that is, the power distribution line 4-1. The deviation-amount computing unit 112, which is a computing unit that, when the measured voltage deviates from the proper voltage range, integrates a deviation amount for a fixed time and calculates an integrated value of the deviation amount. The deviation-notification generating unit 113, when the integrated value of the deviation amount for the fixed time exceeds a threshold, determines that the measured voltage deviates from the proper voltage range, generates deviation information indicating that the measured voltage deviates from the proper voltage range, generates a deviation notification including the deviation information, and outputs the deviation notification to the communication unit 114. The communication unit 114 transmits the deviation notification to the central voltage control device 9 via the second communication network 8.

A cycle at which the measuring unit 111 performs the measurement can be set to any value. As an example, the cycle can be set to one second. As the fixed time in which the deviation-amount computing unit 112 integrates the deviation amount, as an example, one minute can be used. However, the fixed time is not limited to one minute. As the threshold used by the deviation-amount computing unit 112, as an example, 100 volts can be used. However, a value of the threshold is not limited to 100 volts. The fixed time and the threshold can be different for each of the measuring devices.

Figure 4:
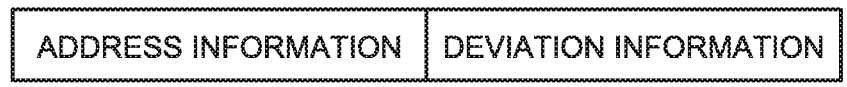
FIG. 4 is a diagram showing a configuration example of a deviation notification.

FIG. 4 is a diagram showing a configuration example of a deviation notification. The deviation notification includes address information, which is identification information for identifying a measuring device at a transmission source, and deviation information. The deviation information is information of minimum one bit. When the deviation information is the information of one bit, the deviation information is flag information of one bit indicating whether deviation exceeding an upper limit of the proper voltage range occurs or deviation lower than a lower limit of the proper voltage range occurs. For example, when the deviation exceeding the upper limit of the proper voltage range occurs, the deviation information is set to "1". When the deviation lower than the lower limit of the proper voltage range occurs, the deviation information is set to "0". When calculating the integrated value of the deviation amount, the deviation-amount computing unit 112 calculates both of a first integrated value, which is an integrated value for the fixed time of a deviation amount exceeding the upper limit of the proper voltage range and a second integrated value, which is an integrated value for the fixed time of a deviation amount lower than the lower limit of the proper voltage range. When the first integrated value exceeds the threshold, the deviation-notification generating unit 113 generates a deviation notification in which "1" is stored as the deviation information. When the second integrated value exceeds the threshold, the deviation-notification generating unit 113 generates a deviation notification in which "0" is stored as the deviation information.

Note that the deviation information is not limited to the flag information of one bit but can be a flag of two bits or more to include information concerning a deviation amount. For example, the deviation information can be set to two bits and configured by a flag indicating a direction of deviation, that is, whether the deviation amount exceeds an upper limit value or is lower than a lower limit value and a flag indicating the deviation amount. For example, when the integrated value of the deviation amount for the fixed time exceeds a first threshold and is equal to or lower than a second threshold, the flag indicating the deviation amount is set to "0". When the integrated value of the deviation amount for the fixed time exceeds the second threshold, the flag indicating the deviation amount is set to "1". Note that the second threshold is set larger than the first threshold. The flag does not have to include the direction of the deviation and can notify that the integrated value of the deviation amount exceeds the threshold. In this case, the central voltage control device 9 cannot grasp the direction of the deviation from the deviation information. However, the central voltage control device 9 estimates which side the deviation of the voltage occurs on the basis of whether a voltage estimated by the central voltage control device 9 is close to the upper limit value of the proper voltage range or close to the lower limit value of the proper voltage range.

In the example explained above, the deviation notification, in which the deviation information is stored, is generated when the deviation amount exceeds the threshold. Alternatively, the deviation notification can be cyclically generated and transmitted. Note that, because the deviation notification is transmitted using the second communication network 8 which is the low-speed communication network, a transmission cycle is set to a cycle of a degree for not oppressing communication of the second communication network 8. As an example, the transmission cycle of the deviation notification can be set to thirty minutes. When the deviation notification is cyclically generated, for example, the deviation information is set to two bits. Different values can be respectively allocated to the deviation information in four cases, that is, when the deviation information indicates that the voltage is within the proper voltage range, when the integrated value for the fixed time of the deviation amount exceeding the upper limit of the proper voltage range exceeds the threshold, when the integrated value for the fixed time of the deviation amount lower than the lower limit of the proper voltage range exceeds the threshold, and when the integrated value is unclear, that is, cannot be determined due to some factor.

In the example explained above, the deviation-amount computing unit 112 calculates the integrated value of the deviation amount. Alternatively, the deviation-amount computing unit 112 can calculate an average or a moving average for the fixed time of the deviation amount. In this case as well, when the value calculated by the deviation-amount computing unit 112 exceeds the threshold, the deviation-notification generating unit 113 generates a deviation notification and outputs the deviation notification to the communication unit 114. The measurement accuracy of the measuring devices 11 to 16 can be lower than the measurement accuracy of the measuring devices 21 and 22.

Correction of a power distribution in this embodiment is explained. As an example, the proper voltage range is decided in advance for each of sections. Note that the proper voltage range can be changed. As explained above, the central voltage control device 9 estimates voltage distributions in the power distribution lines 4-1 and 4-2. Even when there is no part deviating from the proper voltage range according to the estimation, deviation from the proper voltage range sometimes occurs because of, for example, estimation errors of a load and a power generation amount or an increase of facilities not set in the central voltage control device 9.

Figure 5:
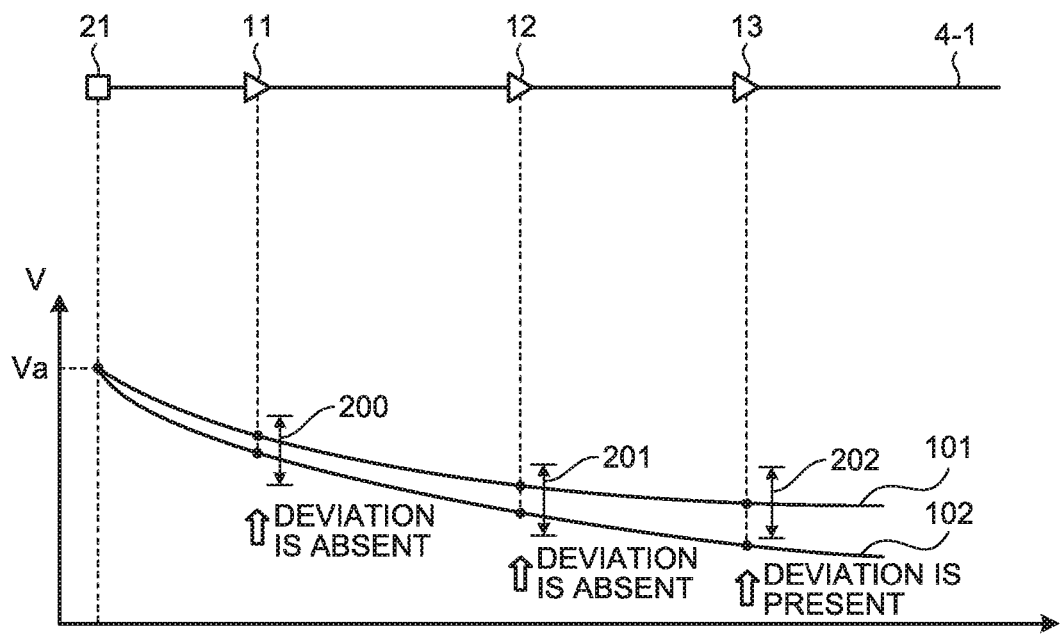
FIG. 5 is a conceptual diagram showing an example in which an estimated voltage distribution and an actual voltage are different and deviation from a proper voltage range occurs.

FIG. 5 is a conceptual diagram showing an example in which an estimated voltage distribution and an actual voltage are different and deviation from the proper voltage range occurs. In FIG. 5, an example of the power distribution line 4-1 is shown. An estimated voltage distribution 101 is a voltage distribution in the power distribution line 4-1 estimated by the voltage-distribution estimating unit 912 of the central voltage control device 9. A voltage distribution 102 is an actual voltage distribution in the power distribution line 4-1. Proper voltage ranges 200, 201, and 202 respectively indicate proper voltage ranges at connecting parts of the measuring devices 11, 12, and 13. Va indicates a voltage measured by the measuring device 21.

As shown in FIG. 5, in the estimated voltage distribution 101, deviation from the proper voltage range does not occur. However, in the example shown in FIG. 5, as shown as the voltage distribution 102, a voltage is actually lower than the lower limit value of the proper voltage range at the connecting part of the measuring device 13. When an integrated value of a deviation amount of the voltage exceeds the threshold in the measuring device 13, the measuring device 13 transmits a deviation notification to the central voltage control device 9.

In the central voltage control device 9, when receiving the deviation notification from the measuring device 13, the correcting unit 913 corrects a power distribution. Specifically, when $\alpha>0$, a virtual load having power consumption $\alpha$, that is, a first virtual facility having electric power $-\alpha$ is disposed at a connecting part of a measuring device connected most upstream, that is, connected to the voltage controller 1 side most or a point of a first position upstream from the connecting part, A virtual generator which generates power $\alpha$, that is, a second virtual facility having electric power $\alpha$ is disposed at a second position upstream of the point where the virtual load is disposed. A power distribution is then recalculated. Note that the first position is upstream of the measurement point of the measuring device that is the transmission source of the deviation notification. However, the first position only has to be the vicinity of the measuring device and can be downstream of the measurement point of the measuring device. In this case, deviation from the proper voltage range is made to occur at the measuring device 13 because of a voltage drop due to the impedance of the power distribution line 4-1. In this case, in the central voltage control device 9, although an actual deviation amount from the proper voltage range is unknown, it is assumed that deviation of a specified amount decided in advance occurs. As an example, the specified amount can be set to 100 volts.

The correcting unit 913 determines a value of $\alpha$ such that deviation of the specified amount occurs from the proper voltage range at the connecting part of the measuring device 13 that is the transmission source of the deviation notification. As explained above, it is assumed that a flag indicating the direction of the deviation is stored in the deviation notification. The virtual generator can be disposed at any point as long as the point is upstream of a point where the virtual load is disposed. As an example, the point where the virtual generator is disposed can be set to, for example, a point further on the downstream side than the measurement point of the measuring device 21 and near the measurement point of the measuring device 21 or a point further on the downstream side than an upstream end of a power distribution section and near the upstream end. The disposition positions of the virtual generator and the virtual load and the value of $\alpha$ are determined to prevent deviation from the proper voltage range from occurring at connecting parts of measuring devices, from which deviation notifications are not received, because the virtual generator and the virtual load are disposed.

Figure 6:
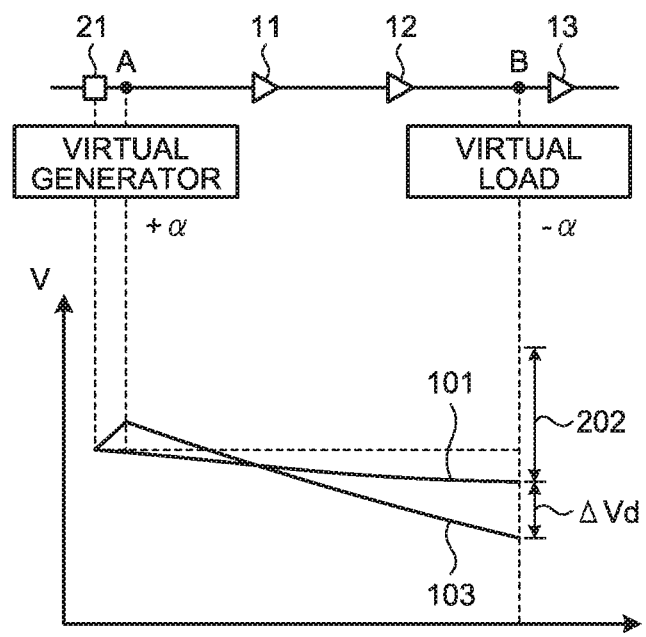
FIG. 6 is a diagram showing an example of disposition of a virtual load and a virtual generator.

FIG. 6 is a diagram showing an example of disposition of the virtual load and the virtual generator. In FIG. 6, as in the example shown in FIG. 5, an example is shown in which, at the measuring device 13, a voltage is lower than the lower limit of the proper voltage range and an integrated value of a deviation amount exceeds the threshold and a deviation notification is transmitted. In this case, the correcting unit 913 disposes a virtual load having electric power $-\alpha$ at a B point further on the upstream side than a connection point of the measuring device 13 and disposes a virtual generator having electric power $\alpha$ at an A point downstream of the measuring device 21. The estimated voltage distribution 101 shown in FIG. 6 is the same as the estimated voltage distribution shown in FIG. 5. A corrected voltage distribution 103 shown in FIG. 6 indicates a voltage distribution after a power distribution is corrected by disposing the virtual generator and the virtual load. It is assumed that electric power and a voltage measured at the connecting part of the measuring device 21 are correct values. In the corrected voltage distribution 103, a voltage rises to be higher than a voltage in the estimated voltage distribution 101 from a voltage measured by the measuring device 21 to an A point, and thereafter drops to be lower than the voltage in the estimated voltage distribution 101 from the A point to a B point because of the impedance of the power distribution line. The correcting unit 913 determines the value of $\alpha$ such that the corrected voltage distribution 103 at the measuring device 13 is lower than the lower limit of the proper voltage range by a specified amount $\Delta Vd$.

The correcting unit 913 corrects a power distribution taking into account connecting positions and respective kinds of electric power of the virtual load and the virtual generator in addition to connecting positions and electric power of facilities taken into account when the power-distribution estimating unit 911 estimates the power distribution. The voltage-distribution estimating unit 912 estimates a voltage distribution on the basis of the corrected power distribution. The tap-position determining unit 914 performs the optimum voltage distribution calculation using the estimated voltage distribution and determines a tap position of the voltage controller 1. The tap-position command unit 915 outputs the determined tap position to the communication unit 93 as a tap position command.

When receiving a deviation notification indicating that the deviation amount exceeds the upper limit value of the proper voltage range, the correcting unit 913 disposes a virtual generator having the electric power $\alpha$, that is, a first facility having the electric power $\alpha$ at the first position on the upstream side of a measuring device which is a transmission source of the deviation notification and in the vicinity of the measuring device. The correcting unit 913 further disposes the virtual load having the electric power $-\alpha$, that is, a second facility having the electric power $-\alpha$ at the second position upstream of the point where the virtual generator is disposed. The correcting unit 913 determines the value of $\alpha$ such that deviation of the specified amount occurs at a connecting position of the measuring device that is the transmission source of the deviation notification.

After performing the correction explained above, the correcting unit 913 stores the connecting positions and the respective kinds of electric power of the virtual load and the virtual generator for correction in the storing unit 92 as the correction data 922 until a fixed time elapses. The correcting unit 913 continues the correction using the correction data 922 until the fixed time elapses. After the fixed time elapses, the correcting unit 913 once stops the correction and returns the power distribution to a state in which the correction is not performed, that is, resets the correction. However, even if the correction is reset in this way, a deviation notification notifying deviation in the same direction is sometimes received from the same measuring device again. When the reset and the reception of the deviation notification in the same direction from the same measuring device are repeatedly carried out a fixed number of times or more, that is, the deviation notification for notifying the deviation in the same direction is received from the same measuring device after the correction is reset, it is highly likely that the measuring device has abnormality or a model of facilities of the power distribution line is wrong. Therefore, when the reset and the reception of the deviation notification in the same direction from the same measuring device are repeatedly carried out the fixed number of times or more, the correcting unit 913 notifies an alarm to an operator. In this case, simultaneously with notifying the alarm, the correcting unit 913 can treat the correction as constant correction and change the model to not perform the reset of the correction.

When receiving deviation notifications from a plurality of measuring devices, the correcting unit 913 only has to perform the correction explained above in order from the measuring device on the upstream side. Note that, when deviation in the same direction is notified from adjacent measuring devices, if the correcting unit 913 performs the correction by the virtual generator and the virtual load explained above concerning the most upstream measuring device out of the measuring devices that transmit the deviation notifications, it is likely that a result is obtained in which connecting parts of the other measuring devices that transmit the deviation notifications also deviate from the proper voltage range. In this case, the correcting unit 913 only has to perform the correction by the virtual generator and the virtual load explained above concerning the most upstream measuring device. When there is a part not deviating from the proper voltage range even if the correction by the virtual generator and the virtual load explained above is performed concerning the most upstream measuring device out of the connecting parts of the measuring devices that transmit the deviation notifications, a virtual generator and a virtual load are further additionally disposed.

Figure 7:
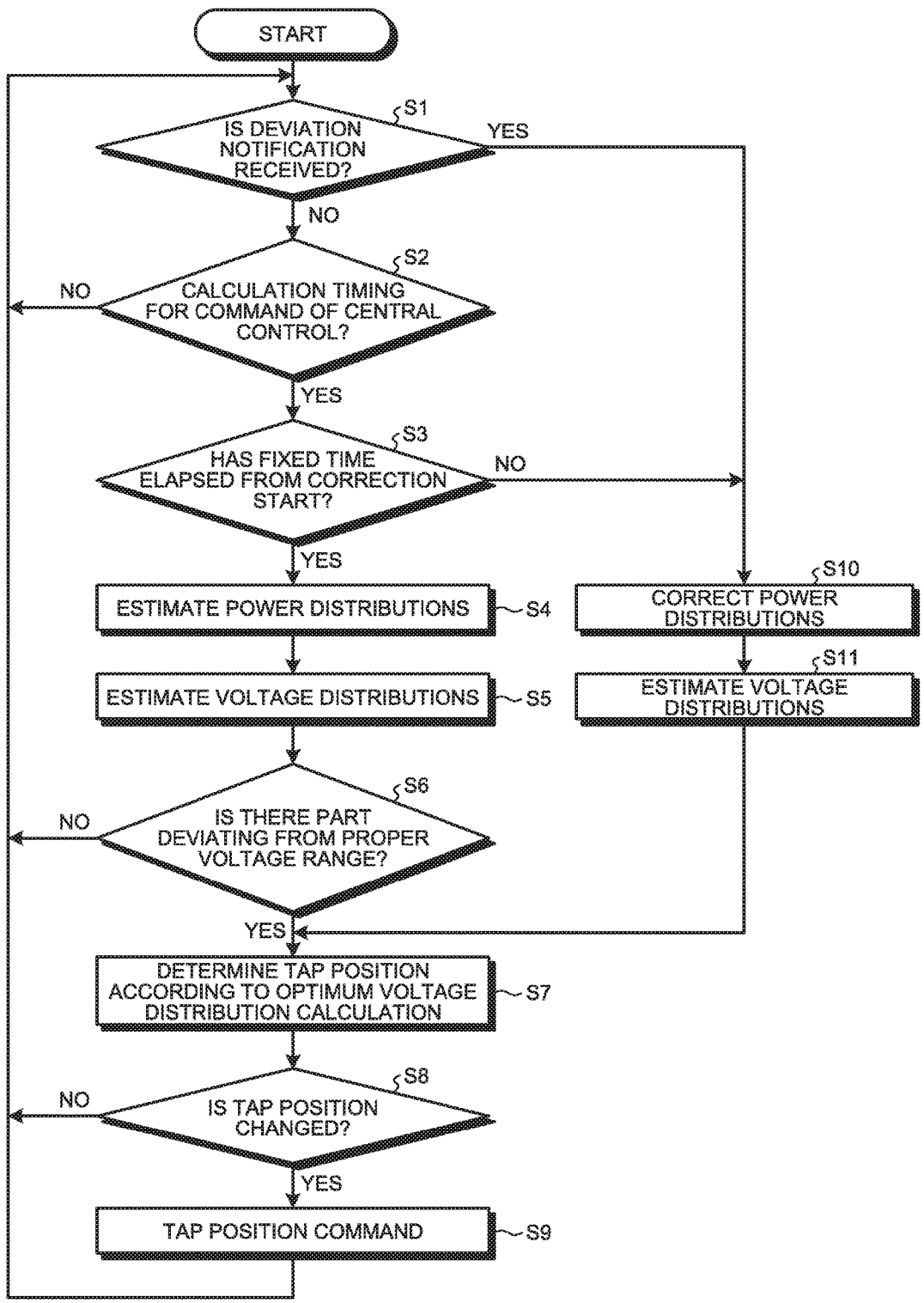
FIG. 7 is a flowchart showing an example of a voltage control procedure.

FIG. 7 is a flowchart showing an example of a voltage control procedure in this embodiment. As shown in FIG. 7, the computation control unit 910 determines whether at least one deviation notification is received from the measuring devices 11 to 16 (step S1). When a deviation notification is not received (No at step S1), the computation control unit 910 determines whether it is calculation timing for a command of central control (step S2). In this embodiment, as explained above, a command of a control amount to the voltage controller 1 is calculated at every central control cycle. Therefore, the calculation timing for the command of the central control occurs at every central control cycle. When it is not the calculation timing for the command of the central control (No at step S2), the processing returns to step S1. When it is the calculation timing for the command of the central control (Yes at step S2), the computation control unit 910 determines whether the fixed time has elapsed from the start of the correction (step S3).

When the fixed time has elapsed from the start of the correction (Yes at step S3), the processing proceeds to step S4. At step S4, the power-distribution estimating unit 911 estimates power distributions in the power distribution lines 4-1 and 4-2 on the basis of measurement information received from the measuring devices 21 and 22 and the facility data 921. At step S3, the computation control unit 910 can determine whether the measurement information received from the measuring devices 21 and 22 has changed. When the measurement information has changed, the processing can proceed to step S4. As an example, when an average in a fixed period of the measurement information received from the measuring devices 21 and 22 changes a fixed amount or more compared with an average calculated last time, the processing can proceeds to step S4.

After step S4, the voltage-distribution estimating unit 912 estimates voltage distributions using the power distributions (step S5). When the correction is not performed, the power distributions used by the voltage-distribution estimating unit 912 at step S5 are the power distributions estimated by the power-distribution estimating unit 911. When the correction is performed, the power distributions are the power distributions corrected by the correcting unit 913.

After step S5, the computation control unit 910 determines on the basis of the voltage distributions estimated by the voltage-distribution estimating unit 912 whether there is a part deviating from the proper voltage range (step S6). When there is a part deviating from the proper voltage range (Yes at step S6), the tap-position determining unit 914 performs the optimum voltage distribution calculation and determines a tap position of the voltage controller 1 (step S7). The tap-position command unit 915 determines whether the determined tap position is changed from the last command (step S8). When the determined tap position is not changed from the last command (No at step S8), the processing returns to step S1. When the determined tap position is changed from the last command (Yes at step S8), the tap-position command unit 915 commands the determined tap position (step S9). That is, the tap-position command unit 915 generates a tap position command on the basis of the determined tap position and outputs the tap position command to the communication unit 93. The communication unit 93 transmits the tap position command to the local voltage control device 10. After step S9, the processing returns to step S1.

On the other hand, when the computation control unit 910 determines at step S6 that there is no part deviating from the proper voltage range (No at step S6), the processing returns to step S1. When the computation control unit 910 determines at step S1 that at least one deviation notification is received (Yes at step S1), the correcting unit 913 corrects the power distribution(s) (step S10). Thereafter, the voltage-distribution estimating unit 912 performs estimation of voltage distribution(s) on the basis of the power distribution(s) after the correction (step S11). The processing proceeds to step S7. When the computation control unit 910 determines at step S3 that the fixed time has not elapsed from the start of the correction (No at step S3), the processing proceeds to step S10. However, when it is determined Yes at step S1 and the processing proceeds to step S10, the correcting unit 913 determines dispositions and respective electric power of the virtual load and the virtual generator on the basis of the deviation notification, corrects the power distributions, and stores data used for the correction in the storing unit 92 as the correction data 922. When it is determined No at step S3 and the processing proceeds to step S10, because the correction data 922 is stored in the storing unit 92, the correcting unit 913 performs correction of the electric power using the correction data 922.

When the measuring device 11 is installed as the sensor switch, a communication unit that performs communication for controlling the switch and the communication unit 114 shown in FIG. 3 can be integrated. In this case, deviation information can be stored in control data, which is exchanged to control the switch, and transmitted. For example, in a control system for the switch, information concerning the switch is cyclically collected by constant polling from a device that controls the switch. In this case, the deviation information can be stored in the information, which is transmitted from the switch in the constant polling, and transmitted. In this case, the device that controls the switch duplicates the information transmitted by the sensor switch to which the measuring device 11 is implemented and transmits the information to the central voltage control device 9. Alternatively, the sensor switch transmits the information to both of the central voltage control device 9 and the device that controls the switch. Because a bit for the deviation information is allocated to the information transmitted from the sensor switch by the polling, the deviation information is also transmitted when the integrated value of the deviation amount does not exceed the threshold. Therefore, the deviation information is configured to include information indicating presence or absence of deviation. For example, when the deviation information has one bit, two values are used to indicate presence and absence of deviation. When the deviation information has two bits, one bit indicates presence or absence of deviation and the other one bit indicates the direction of the deviation.

When the measuring device 11 is mounted independently from the switch rather than being implemented to the sensor switch, it is also possible to regard the measuring device 11 as a kind of the switch and transmit the deviation information through the constant polling using a communication network for controlling the switch serving as the second communication network 8.

As explained above, in this embodiment, the voltage control system includes the measuring devices 21 and 22 that cyclically transmit measurement information and the measuring devices 11 to 16 that transmit deviation information having a smaller information amount than the measurement information and indicating that a voltage deviates from the proper voltage range. The central-voltage control device 9 estimates power distributions on the basis of the measuring devices 21 and 22, determines a control amount of the voltage controller 1 on the basis of the estimated power distributions, when receiving the deviation information from the measuring devices 11 to 16, corrects the power distributions on the basis of the deviation information, and determines a control amount of the voltage controller 1 on the basis of the corrected power distributions. Therefore, it is possible to reduce cost and suppress deviation from the proper voltage range in the power distribution lines.

The configuration explained in the embodiment indicates an example of content of the present invention and can be combined with other publicly-known technologies or a part of the configuration can be omitted or changed without departing from the spirit of the present invention.

REFERENCE SIGNS LIST 1 voltage controller
2 bus
3-1, 3-2 breaker
4-1, 4-2 power distribution line
5 load
6 generator
7 first communication network
8 second communication network
9 central voltage control device
10 local voltage control device
11 to 16, 21, 22 measuring device
91 computing unit
92 storing unit
93, 114 communication unit 111 measuring unit
112 deviation-amount computing unit
113 deviation-notification generating unit
910 computation control unit
911 power-distribution estimating unit
912 voltage-distribution estimating unit
913 correcting unit
914 tap-position determining unit
915 tap-position command unit
921 facility data
922 correction data

The invention claimed is:

1. A central voltage control device in a voltage control system including a first measuring device configured to measure a voltage and electric power of a power distribution line of a high-voltage system and transmit the measured voltage and the measured electric power as measurement information, a second measuring device configured to measure the voltage of the power distribution line and transmit deviation information, which is information indicating whether the measured voltage deviates from a proper voltage range, an information amount of the deviation information being smaller than an information amount of the measurement information, and a voltage controller configured to control the voltage of the power distribution line, the central voltage control device comprising:
   a power-distribution estimating unit to estimate a power distribution in the power distribution line on the basis of the measurement information received from the first measuring device;
   a voltage-distribution estimating unit to estimate a voltage distribution in the power distribution line on the basis of the power distribution;
   a control-amount determining unit to determine a control amount of the voltage controller when there is a part where a voltage deviates from the proper voltage range in the voltage distribution; and
   a correcting unit to correct the power distribution in the power distribution line on the basis of the deviation information received from the second measuring device, wherein
   when the power distribution in the power distribution line is corrected by the correcting unit, the voltage-distribution estimating unit estimates the voltage distribution of the power distribution line using the corrected power distribution.

2. The central voltage control device according to claim 1, wherein, when an integrated value in a fixed period of a deviation amount of the measured voltage from the proper voltage range exceeds a threshold, the second measuring device determines that the measured voltage deviates from the proper voltage range.

3. The central voltage control device according to claim 1, wherein the second measuring device transmits the deviation information when an integrated value in a fixed period of a deviation amount of the measured voltage from the proper voltage range exceeds a threshold.

4. The central voltage control device according to claim 1, wherein the deviation information includes information for identifying whether the measured voltage is within the proper voltage range or whether the measured voltage deviates from the proper voltage range.

5. The central voltage control device according to claim 1, wherein the deviation information is information of one bit indicating whether deviation exceeding an upper limit value of the proper voltage range occurs or whether deviation smaller than a lower limit value of the proper voltage range occurs.

6. The central voltage control device according to claim 1, wherein the deviation information includes information indicating magnitude of a deviation amount of the measured voltage from the proper voltage range.

7. The central voltage control device according to claim 1, wherein the central voltage control device receives the measurement information from the first measuring device via a first communication network and receives the deviation information from the second measuring device via a second communication network having transmission speed lower than transmission speed of the first communication network.

8. The central voltage control device according to claim 7, wherein the second communication network is a communication network used for transmission of control information for controlling a switch connected to the power distribution line.

9. The central voltage control device according to claim 1, wherein the second measuring device is implemented to be integrated with a switch connected to the power distribution line.

10. The central voltage control device according to claim 1, wherein, when determining on the basis of the received deviation information that deviation lower than a lower limit of the proper voltage range occurs, the correcting unit
   disposes a first facility at a first position of the power distribution line and disposes a second facility at a second position upstream of the first position,
   determines the first position, the second position, and electric power consumed by the first facility and electric power generated by the second facility such that the electric power consumed by the first facility is equal to the electric power generated by the second facility and a voltage at a measurement point of the second measuring device that is a transmission source of the received deviation information deviates from the proper voltage range by a fixed amount, and
   calculates a power distribution after the correction by calculating a power distribution on the basis of a determined result assuming that the first facility and the second facility are connected to the power distribution line.

11. The central voltage control device according to claim 1, wherein, when determining on the basis of the received deviation information that deviation exceeding an upper limit of the proper voltage range occurs, the correcting unit
   disposes a first facility at a first position of the power distribution line and disposes a second facility at a second position upstream of the first position,
   determines the first position, the second position, and electric power generated by the first facility and electric power consumed by the second facility such that the electric power generated by the first facility is equal to the electric power consumed by the second facility and a voltage at a measurement point of the second measuring device that is a transmission source of the received deviation information deviates from the proper voltage range by a fixed amount, and
   calculates a power distribution after the correction by calculating a power distribution on the basis of a determined result assuming that the first facility and the second facility are connected to the power distribution line.

12. A second measuring device in a voltage control system including a first measuring device configured to measure a voltage and electric power of a power distribution line of a high-voltage system and transmit the measured voltage and the measured electric power as measurement information, the second measuring device configured to measure the voltage of the power distribution line and transmit deviation information, which is information indicating whether the measured voltage deviates from a proper voltage range, an information amount of the deviation information being smaller than an information amount of the measurement information, a voltage controller configured to control the voltage of the power distribution line, and a central voltage control device configured to estimate a power distribution in the power distribution line on the basis of the measurement information received from the first measuring device, estimate a voltage distribution in the power distribution line on the basis of the power distribution, determine a control amount of the voltage controller when there is a part where a voltage deviates from the proper voltage range in the estimated voltage distribution, correct the power distribution in the power distribution line on the basis of the deviation information received from the second measuring device, and, when the power distribution in the power distribution line is corrected, estimates the voltage distribution of the power distribution line using the corrected power distribution, the second measuring device comprising:

a measuring unit to measure the voltage of the power distribution line;

deviation-notification generating unit to generate the deviation information on the basis of the measured voltage and generate a deviation notification in which the deviation information is stored, and a communication unit to transmit the deviation notification to the central voltage control device.

* * * * *